April 19, 1966 M. COOPERMAN 3,247,398

TRIGGERABLE TUNNEL DIODE BISTABLE CIRCUITS

Filed June 16, 1963 3 Sheets-Sheet 1

INVENTOR.
MICHAEL COOPERMAN
BY John V. Regan
Attorney

April 19, 1966 M. COOPERMAN 3,247,398

TRIGGERABLE TUNNEL DIODE BISTABLE CIRCUITS

Filed June 16, 1963 3 Sheets-Sheet 2

INVENTOR.
MICHAEL COOPERMAN
BY John V. Regan
Attorney

TRIGGERABLE TUNNEL DIODE BISTABLE CIRCUITS

Filed June 16, 1963 3 Sheets-Sheet 3

INVENTOR.
MICHAEL COOPERMAN
BY John V. Regan
Attorney

United States Patent Office 3,247,398
Patented Apr. 19, 1966

3,247,398

TRIGGERABLE TUNNEL DIODE BISTABLE CIRCUITS

Michael Cooperman, Cherry Hill, N.J., assignor to Radio Corporation of America, a corporation of Delaware Filed July 16, 1963, Ser. No. 295,408
6 Claims. (Cl. 307—88.5)

This invention relates to tunnel diode circuits, and more particularly to triggerable tunnel diode circuits.

A tunnel diode bistable circuit exhibits two stable operating states and produces an output of either a high or a low level but not both simultaneously. A tunnel diode flip-flop includes two tunnel diode bistable circuits and produces outputs of both a high and a low level simultaneously. In tunnel diode logic circuits which include bistable circuits and flip-flops, it is desirable to make such circuits triggerable between their stable operating states by the application thereto of trigger input pulses.

Accordingly, it is an object of this invention to provide an improved triggerable tunnel diode bistable circuit.

It is another object of this invention to provide an improved triggerable tunnel diode flip-flop.

In accordance with one aspect of the invention, a triggerable tunnel diode flip-flop comprises first and second tunnel diodes each biased to operate bistably between a pair of stable operating states. The first and second tunnel diodes are coupled, respectively, to first and second inverters and cross-coupled to each other by coupling the first tunnel diode to the second inverter and the second tunnel diode to the first inverter. The first and second tunnel diodes are initially set to opposite stable states. An input trigger pulse applied to both tunnel diodes switches one diode from one stable state to the other thereby producing a transition signal. The transition signal is inverted and applied to switch the other tunnel diode back to the one stable state. Successive input trigger pulses cause the first and second tunnel diodes to successively switch between their stable operating states producing complementary outputs therefrom.

In accordance with a second aspect of the invention, a triggerable tunnel diode bistable circuit includes a tunnel diode biased to operate bistably between a pair of stable operating states, and an inverter coupled to the diode. A trigger input pulse of a predetermined polarity is applied to the tunnel diode and through a coupling network to the inverter. The application of the trigger input pulse to the inverter is controlled by the coupling network. The coupling network is in turn controlled by the operating state of the tunnel diode. When the tunnel diode is operating in one stable state, the coupling network blocks the input pulse. When the tunnel diode is operating in the other stable state, the input pulse is passed by the coupling network. The polarity of the input trigger pulse is such that it switches the diode only when the diode is initially operating in the one stable state. Thus, when the tunnel diode is switched from the one stable state to the other stable state by an input pulse, the coupling network blocks the input pulse from reaching the inverter. When the tunnel diode is operating in the other state, an input pulse is passed by the coupling network, inverted in the inverter, and applied to switch the tunnel diode back to the one stable state. Successive applications of input pulses switch the tunnel diode back and forth between its two stable operating states.

Figure 1:
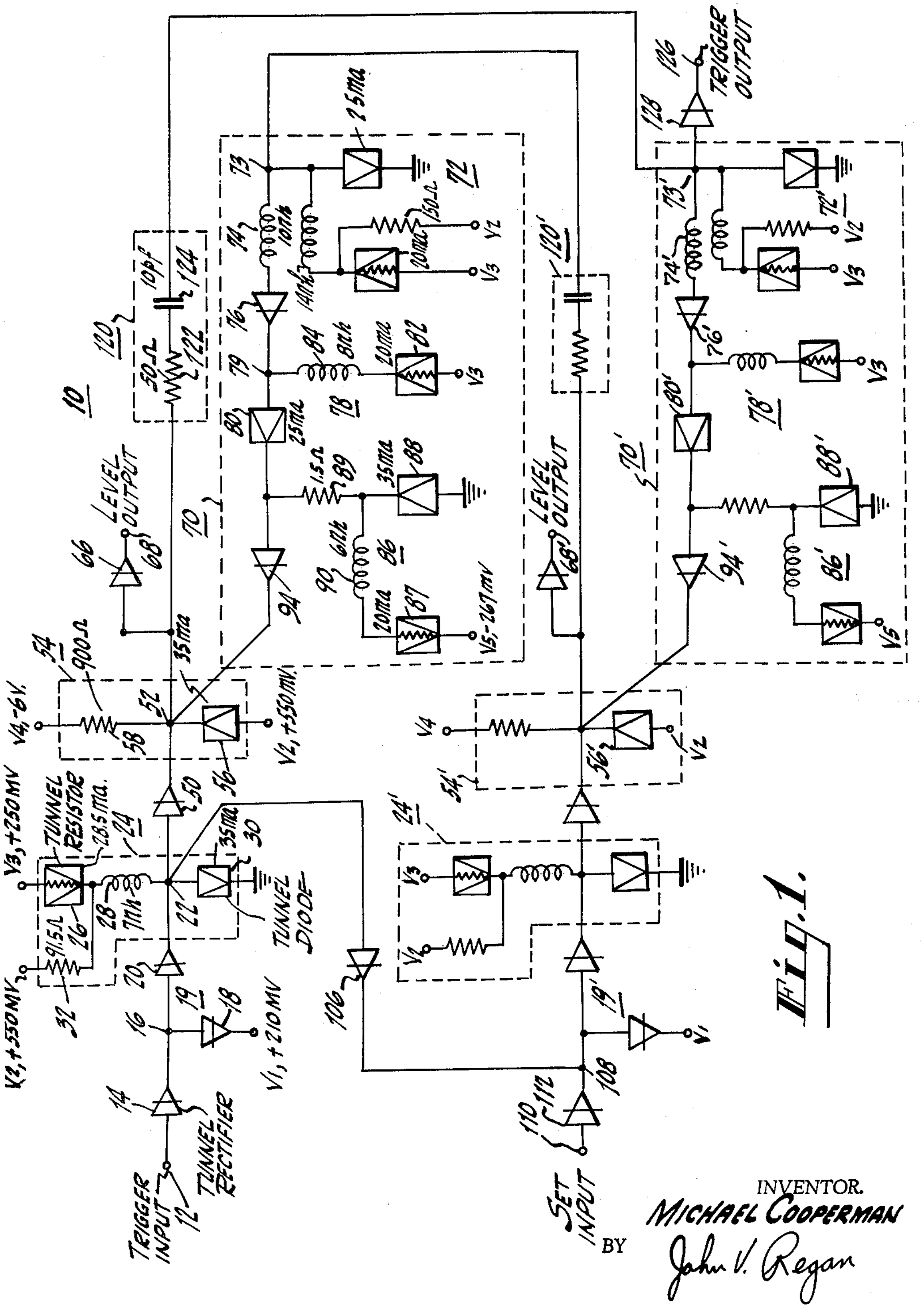
FIGURE 1 is a schematic circuit diagram of a triggerable flip-flop in accordance with the invention.

Referring now to FIGURE 1, a triggerable tunnel diode flip-flop 10 includes an input terminal 12 to which trigger input pulses are applied. The flip-flop 10 is arranged to respond to positive input pulses. By properly poling the various rectifiers and diodes it can be arranged to respond to negative input pulses. Such input pulses may, for example, have a magnitude of 200 millivolts (mv.). A tunnel rectifier 14 is coupled between the input terminal 12 and the junction 16 of a pair of tunnel rectifiers 18 and 20. The tunnel rectifiers 14, 18 and 20 are all poled in the direction of easy current flow from the input terminal 12. However, the cathode of the tunnel rectifier 18 is connected to a positive potential source $V_1$, which may, for example, have a magnitude of +210 mv. Thus, the rectifier 18 is reverse biased even when trigger input pulses are applied to the terminal 12.

Figure 2:
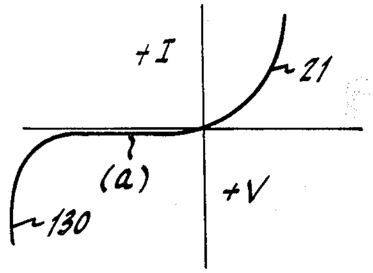
FIGURE 2 is a graph illustrating the current-voltage characteristic of a tunnel rectifier.

Tunnel rectifiers are described, for example, in an article by Lesk et al. appearing in the 1959 IRE Wescon Convention Record, Part III, page 9. In the article, the tunnel rectifier is referred to as a "backward diode" but the device has since become more commonly known as a "tunnel rectifier." The current-voltage characteristic curve 21 for such tunnel rectifiers is shown in FIGURE 2. It is to be noted that a tunnel rectifier exhibits a low impedance for forward conduction and a high impedance for reverse conduction. However, at high reverse bias voltages of, for example −500 mv., the tunnel rectifier once against presents a low impedance to current conduction.

The tunnel rectifier 14 functions in the flip-flop 10 to provide unidirectional current flow. The rectifiers 18 and 20 function as a terminating network 19 for the pulse source which is coupled to the input terminal 12. The terminating network 19 provides a constant impedance load for the pulse source and prevents reflections back thereto. The pulse source may, for example, comprise another tunnel diode circuit and more than one source may be coupled through tunnel rectifiers to the junction point 16 in the flip-flop 10.

The tunnel rectifier 18 is biased in the reverse direction by the voltage source $V_1$ such as to the point (*a*) in the characteristic curve 21 of FIGURE 2. A trigger input pulse on the order of 200 millivolts causes the tunnel rectifier 14 to conduct in the forward direction but the rectifier 18 is still reverse biased and prevents the input current from flowing through it. Thus, the input current is coupled through the tunnel rectifier 20.

The cathode of the rectifier 20 is coupled to an input-output terminal 22 of a pulse amplifier 24. The pulse amplifier 24 includes the series combination of a tunnel resistor 26, an inductor 28, and a tunnel diode 30 coupled between a source of positive potential $V_3$ and a point of common potential, or ground, in the circuit. The potential source $V_3$ may, for example, have a magnitude of +250 mv. A trimming resistor 32 is coupled between the junction of the inductor 28 and tunnel resistor 26 and a source of positive potential $V_2$ of, for example, +550 mv.

Figure 3:
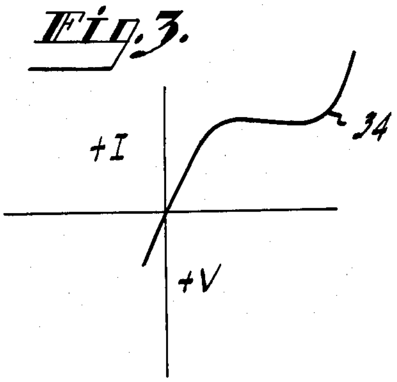
FIGURE 3 is a graph illustrating the current-voltage characteristic of a tunnel resistor.

A tunnel resistor is described, for example, in the RCA Technical Manual TD–30, entitled "Tunnel Diodes For Switching and Microwave Application." A tunnel resistor comprises the combination of a resistor shunted across the terminals of a tunnel diode with both encapsulated in the same package. The current-voltage characteristic curve 34 of a tunnel resistor is shown in FIGURE 3 and it is to be noted that a tunnel resistor includes a region of substantially constant current. The magnitude of the constant current region is determined by the peak current point of the tunnel diode in the package.

Figure 4:
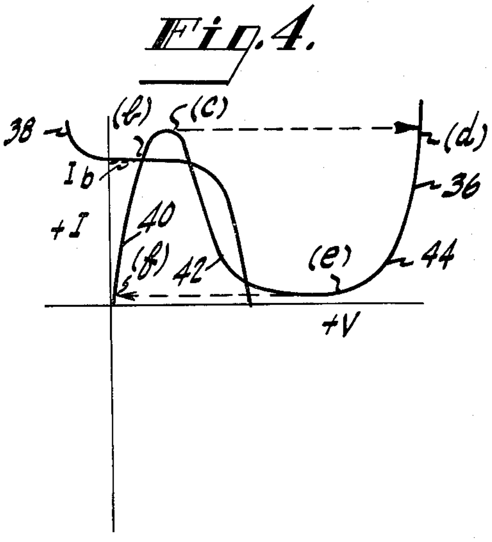
FIGURES 4 and 5 are graphs illustrating the current-voltage characteristic of tunnel diodes biased to operate monostably.

The tunnel diode 30 in the pulse amplifier 24 is biased for monostable operation by the tunnel resistor 26 and trimming resistor 32. In FIGURE 4, the curve 36 shows the current-voltage characteristic of a tunnel diode. The curve 38 in FIGURE 4 is an idealized version of the load line characteristic exhibited by the combination of the tunnel resistor 26 and trimming resistor 32 to the tunnel diode 30. The load line 38 is shown in FIGURE 4 reversed from the characteristic 34 in FIGURE 3 to denote the fact that the resistors 26 and 32 function as a quiescent load on the tunnel diode 30. The trimming resistor 32 in the circuit shapes the composite of the characteristic curve 34 (FIGURE 3) of the tunnel resistor 26 and the trimming resistor to exhibit a desired load on the tunnel diode 30.

The load line 38 intercepts the characteristic curve 36 in the first positive resistance or low voltage region 40 of the tunnel diode 30, such as at the point (*b*). The other two intersections of the load line 38 and the characteristic curve 36 both occur in the negative resistance region 42 and hence are unstable operating points. A quiescent bias current having an amplitude $I_b$ flows through the tunnel diode 30 in the absence of an input pulse.

The coupling of an input pulse through the tunnel rectifier 20 causes a momentarily increased current through the tunnel diode 30. The increased current causes the tunnel diode 30 to switch forth and back through its negative resistance region 42, such as from the point (*c*) to the point (*d*) in FIGURE 4 and then from the point (*e*) to the point (*f*) back to the point (*b*). The points (*d*) and (*e*) lie in the second positive resistance or high voltage region 44 of the characteristic curve 36. The switching of the tunnel diode 30 forth and back through its negative resistance region produces an output pulse which is derived from the input-output terminal 22 of the pulse amplifier 24 in FIGURE 1.

Figure 6:
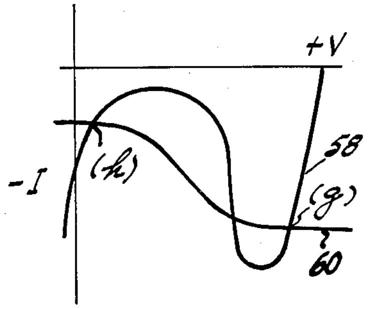
FIGURE 6 is a graph illustrating the current-voltage characteristic of a tunnel diode biased to operate bistably.

A tunnel rectifier 50 is coupled between the terminal 22 of the amplifier 24 and the input-output terminal 52 of a first tunnel diode bistable circuit 54. The bistable circuit 54 includes the series combination of a tunnel diode 56 and a resistor 58 connected between the potential source $V_2$ and a negative potential source $V_4$ of, for example, −6 volts. The characteristic curve 58 of the tunnel diode 56 in the bistable circuit 54 is shown in FIGURE 6 in the fourth quadrant due to the poling of the diode 56. The diode 56 is bistably biased and the load line for this biasing is shown by the curve 60 in FIGURE 6. The curve 60 is due not only to the biasing resistor 58 but also due to the input-output circuit loads on the diode 56. It is to be noted that the curve 60 intercepts the positive resistance portions of the tunnel diode characteristic 58 at the points (*g*) and (*h*). When the diode 56 is operating at the point (*g*), a high voltage level output is produced which may denote a binary "1." When the diode 56 is operating at the point (*h*), a low voltage level output is produced and may denote a binary "0." The output level is derived from the diode 56 by coupling a tunnel rectifier 66 to the terminal 52 and providing an output terminal 68 at the cathode of the rectifier 66.

The bistable circuit 54 also has coupled thereto a first pulse inverting circuit 70 (FIGURE 1). The pulse inverter 70 includes a pulse amplifier 72 which is monostably biased similar to the pulse amplifier 24. The input-output terminal 73 of the amplifier 72 is coupled through the series combination of an inductor 74 and a tunnel rectifier 76 to an inverter driving stage 78. The inverter driver 78 includes a tunnel diode 80 which is monostably biased by the series combination of a tunnel resistor 82 and inductor 84 coupled to the potential source $V_3$.

Figure 5:
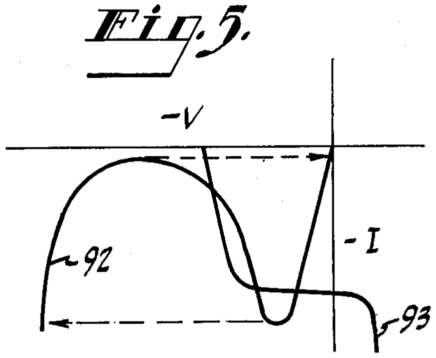

The cathode of the tunnel diode 80 in the inverter driver 78 is coupled to an inverter 86. The inverter 86 includes the series combination of a tunnel diode 88 and a resistor 89 coupled between ground and the cathode of the tunnel diode 80 in the inverter driver stage 78. A tunnel resistor 87 and an inductor 90 are coupled between a source of negative potential $V_5$ which may, for example, have a magnitude of −267 mv. and the cathode of the tunnel diode 88. The tunnel diode 88 is monostably biased and the diode characteristic 92 and load line 93 are shown in FIGURE 5. The curves appear in the third quadrant due to the poling of the diode 88. The pulse inverting circuit 70 is coupled through a tunnel rectifier 94 to the input-output terminal 52 of the bistable circuit 54.

The input-output terminal 22 of the pulse amplifier 24 is also coupled through a tunnel rectifier 106 to a terminal 108 of the flip-flop 10, which terminal 108 functions as a set terminal for the flip-flop 10. A set input pulse also may be applied through the set input terminal 110 and tunnel rectifier 112 to the terminal 108.

The sceond half of the flip-flop 10 also includes a pulse amplifier 24′, a second tunnel diode bistable circuit 54′, and a second pulse inverting circuit 70′ and the various couplings therefor. These circuits and components are similar to those previously described and have therefore been given the same reference numerals but the numerals are primed.

The first and second bistable circuits 54 and 54′ are cross-coupled to each other by means of coupling networks 120 and 120′. The first bistable circuit 54 is coupled through the network 120, which comprises the series combination of a resistor 122 and a capacitor 124, to the input terminal 73′ of the second pulse inverting circuit 70′, while the second bistable circuit 54′ is coupled through the network 120′ to the input terminal 73 of the first pulse inverting circuit 70. The cross-coupling networks 120 and 120′ function as differentiators to differentiate the transition signal when the diodes 56 and 56′ switch to their high voltage states. A trigger terminal 126 is provided in the flip-flop 10 by connecting a tunnel rectifier 128 to the terminal 73′ of the pulse inverting circuit 70′.

In describing the operation of the flip-flop 10, it will be assumed that the first bistable circuit 54 is operating in its low voltage state such as at the point (*h*) in FIGURE 6 and the second bistable circuit 54′ is operating in its high state such as at the point (*g*) in FIGURE 6. Under this condition, a high level output signal or binary "1" is produced at the output terminal 68′ while a low level output signal or binary "0" is produced at the output terminal 68. When operated in this condition, the flip-flop is set. The flip-flop 10 may be initially set in this state by applying a positive pulse to the set input terminal 110.

The application of a positive trigger input pulse to the terminal 12 causes the flip-flop 10 to change from its initial set condition to its reset condition. The input trigger pulse is amplified in the amplifier 24 and switches the tunnel diode 56 to its high voltage operating state, i.e., to the point (*g*) in FIGURE 6. The transition signal or leading edge of the high voltage level output signal is differentiated by the differentiator 120 and applied to the terminal 73′ of the second pulse inverting circuit 70′. Additionally, an amplified trigger input pulse is also applied from the amplifier 24 through the tunnel rectifier 106 to the pulse amplifier 24′. The amplified positive pulse from the amplifier 24′ does not switch the diode 56′ in the second bistable circuit 54′ because this diode is already operating in its high voltage state.

The differentiated pulse from the coupling network 120 is applied to the pulse inverter 70′ and amplified by the pulse amplifier 72′. The amplified pulse is coupled through the inductor 74′ and rectifier 76′ to the inverter driver 78′. The pulse causes the diode 80′ in the inverter driver 78′ to switch rapidly through its negative resistance region, such as from (*c*) to (*d*) in FIGURE 4. The current through the diode 80′ decreases until the point (*e*) is reached and then the diode 80′ switches back through its negative resistance region to the point (*f*) in FIGURE 4. The decrease in current through the diode 80′ in the inverter driver 78′, when moving from the points (*d*) to (*e*) in FIGURE 4, effectively applies a negative-going current pulse to the diode 88′ in the inverter 86′. The diode 88′ therefore switches to its high state and back again to produce a negative output voltage pulse, as shown by the dotted lines in FIGURE 5. Thus, the positive input trigger voltage pulse has now been inverted.

The negative pulse causes the tunnel rectifier 94′ to conduct in the reverse breakdown portion of its characteristic curve, such as in the portion 130 of the curve 21 in FIGURE 2. A negative-going pulse is therefore applied to the diode 56′ in the second bistable circuit 54′. The diode 56′ switches from the point (*g*) in FIGURE 5 to its low voltage point (*h*). Thus, the output voltage at the terminal 68′ decreases to a low level and produces the complement of the output of the terminal 68. The flip-flop 10 is therefore reset. Successive trigger input pulses alternately set and reset the flip-flop 10.

Thus, a tunnel diode flip-flop circuit is provided which is switched alternately between set and reset conditions by trigger input pulses to produce complementary high and low output signals. Representative values of components of the flip-flop are shown in FIGURE 1.

Figure 7:
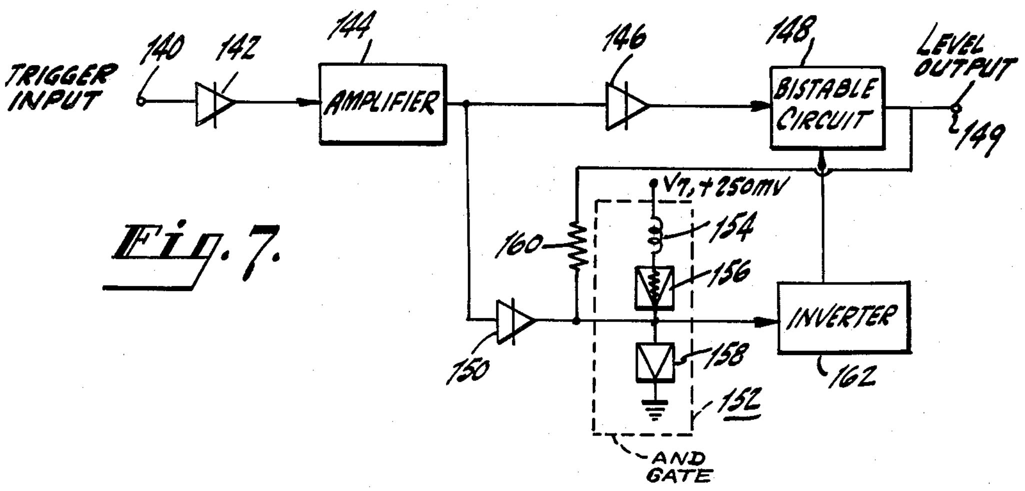
FIGURE 7 is a schematic circuit diagram of one embodiment of a triggerable tunnel diode bistable circuit in accordance with the invention; and, FIGURE 8 is another embodiment of a triggerable tunnel diode bistable circuit.

Referring now to FIGURE 7, a triggerable bistable circuit is shown. The triggerable bistable circuit includes a trigger input terminal 140 which is coupled through a tunnel rectifier 142 to a pulse amplifier 144. The pulse amplifier 144 may, for example, be identical to the combination of the terminating network 19 and amplifier 24 in FIGURE 1. The amplifier 144 is coupled through a tunnel rectifier 146 to a tunnel diode bistable circuit 148. The tunnel diode bistable circuit may, for example, be identical to the bistable circuit 54 in FIGURE 1. A voltage level output which may be either high, denoting a binary "1," or low, denoting a binary "0," is derived from an output terminal 149. The amplifier 144 is also coupled through a tunnel rectifier 150 to a coupling network 152. The coupling network 152 may, for example, comprise an AND gate including the series combination of an inductor 154, a tunnel resistor 156, and a tunnel diode 158 all coupled in series between the positive potential source $V_3$ (+250 mv.) and ground. The other input to the AND gate 152 is derived from the output terminal 149 of the bistable circuit 148, which is coupled through a resistor 160 to the AND gate 152. The output of the AND gate 152 is coupled to an inverter 162. The inverter 162 may, for example, be identical to the pulse inverting circuit 70 of FIGURE 1. However, in many applications the amplifier 72 and inductor 74 (FIGURE 1) are not required and may be removed. The AND gate 152 is then directly connected to the anode of the tunnel rectifier 76 in FIGURE 1. The inverter 162 is coupled to the bistable circuit 148 in a manner similar to the way in which the inverting circuit 70 is coupled to the tunnel diode 56 in FIGURE 1.

The triggerable bistable circuit 148 switches from one stable state to the other on the application of each trigger input pulse to the input terminal 140. The tunnel diode 158 in the AND gate 152 is monostably biased such as in the first positive resistance region 40 of FIGURE 4. When the bistable circuit 148 is operating in its high voltage state, such as at the point (*g*) in FIGURE 6, the high level output from the bistable circuit 148 raises the quiescent current through the tunnel diode 158 almost to the peak current point (*c*) in FIGURE 4. When the bistable circuit 148 is operating in its low voltage state, such as at hte point (*h*) in FIGURE 6, the low level output from the bistable circuit 148 keeps the quiescent current through the tunnel diode 158 removed from the current peak point (*c*) in FIGURE 4 so that a trigger input pulse will not drive the diode over the peak. Thus, the AND gate 152 is not enabled when the bistable circuit is operating in its low state.

When the bistable circuit 148 is set, i.e., is operating in its "high" state, the application of a positive trigger input pulse makes no change in the bistable circuit 148. However, the AND gate 152 is activated and produces a positive output pulse. The positive output pulse is inverted by the inverter 162 and applied to switch the bistable circuit 148 to its low state. When the bistable circuit 148 is reset, i.e., operating in its "low" state, a trigger input pulse switches the bistable circuit 148 to its "high" voltage state. However, the trigger input pulse is blocked by the AND gate 152 and thus no pulse is applied to the inverter 160. Successive applications if trigger input pulses alternately reset and set the bistable circuit 148. It is to be noted that the setting of the bistable circuit 148 is a one-step operation, while the resetting thereof is a two-step operation. The inherent delay in the bistable circuit 148 prevents "racing" conditions. To further insure reliable operation, an additional delay circuit of, for example, 1 nano-second (ns.) may be coupled between the terminal 149 and resistor 160. Such a delay circuit does not affect the operating speed of the circuit.

Figure 8:
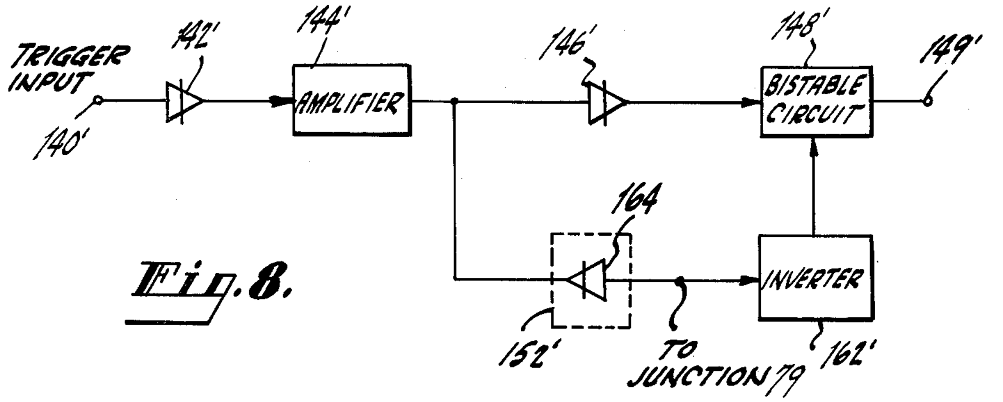

Referring now to FIGURE 8, a triggerable bistable circuit is shown. Parts identical to those in FIGURE 7 are given the same reference numerals but the numerals are primed. In this embodiment, the coupling network 152′ comprises a tunnel rectifier 164 poled in the reverse direction from the amplifier 144′ to the inverter 162′. Additionally, the coupling network 152′ is connected to a different point of the inverter than the network 152 in FIGURE 7. The anode of the tunnel rectifier 164 in the coupling network 152′ is connected directly to the junction point 79 of the pulse inverting circuit 70 in FIGURE 1. Thus, the amplifier 72, inductor 74, and rectifier 76 are removed.

A large input signal applied to the reverse poled tunnel rectifier 164 causes the rectifier 164 to conduct heavily in the reverse direction, such as in the region 130 in FIGURE 2. A large input signal is available when the bistable circuit 148′ is operating in its set or "high" state because substantially no portion of the input trigger pulse is absorbed by the bistable circuit 148′ when operating in this state. Conversely, when the bistable circuit 148′ is operating in its reset or "low" state, substantially all of the input trigger pulse is required to set the bistable circuit 148′. Therefore, the input signal to the tunnel rectifier 164 is insufficient to drive it to breakdown.

In operation, a positive input trigger pulse causes the tunnel rectifier 164 to conduct heavily in the reverse direction when the bistable circuit 148′ is set. The positive pulse is inverted by the inverter 162′ and the inverted pulse is applied to switch the bistable circuit 148′ to its reset or "low" voltage state. When the bistable circuit 148′ is reset, a positive input pulse triggers it to its set or "high" state. Thus, the tunnel diode bistable circuit is alternately triggered from one stable state to the other upon the receipt of each successive trigger input pulse.

What is claimed is:

1. A triggerable flip-flop comprising in combination,
first and second tunnel diodes each biased to operate bistably between a pair of stable operating states,
means for initially setting one of said tunnel diodes to one stable state and the other to the other stable state, means for applying an input signal to both of said tunnel diodes to switch said one tunnel diode to said other stable state, said one tunnel diode producing, when switching, a transition signal, and means for inverting said transition signal and applying it to switch said other tunnel diode to the said one stable state.

2. A triggerable flip-flop comprising in combination, first and second tunnel diodes biased to operate bistably between a pair of stable operating states, first and second inverters coupled to said first and second tunnel diodes, respectively, cross-coupling means for connecting said first tunnel diode to said second inverter and said second tunnel diode to said first inverter, and means for applying trigger input pulses of the same polarity to both of said tunnel diodes to cause them to switch to opposite stable states.

3. A triggerable flip-flop comprising in combination, first and second tunnel diodes each biased to operate bistably between a pair of stable operating states, means for initially setting one of said tunnel diodes to one stable state and the other to the other stable state, first and second inverters coupled to said first and second tunnel diodes, respectively, cross-coupling means including a first differentiator for connecting said first tunnel diode to said second inverter and a second differentiator for connecting said second tunnel diode to said first inverter, and means for applying trigger input pulses of the same polarity to both said tunnel diodes to switch said one tunnel diode from said one stable state to the other stable state, whereby the said one tunnel diode produces, when switching, a transition signal which is differentiated, inverted and applied to switch said other tunnel diode from the said other stable state to said one stable state.

4. A triggerable bistable circuit comprising in combination, a bistable circuit including a tunnel diode biased to operate bistably between a first and a second stable state, an inverter coupled to said tunnel diode, in said bistable circuit, an AND gate having an output terminal coupled to said inverter, and a pair of input terminals, means coupling said tunnel diode to one of said input terminals of said AND gate to apply a disabling signal to said AND gate when operated in said first stable state and an enabling signal when operated in said second stable state, and means for applying trigger input pulses to both said tunnel diode in said bistable circuit and the second input terminal of said AND gate to cause said tunnel diode to alternately switch between said first and second stable states.

5. A triggerable bistable circuit comprising in combination, a bistable circuit including a tunnel diode biased to operate bistably between a first and a second stable state, an inverter coupled to said tunnel diode in said bistable circuit, a tunnel rectifier having an anode and a cathode, means coupling said anode of said tunnel rectified to said inverter, said tunnel rectifier exhibiting a current voltage characteristic which includes a high impedance region for input signals of flow magnitude applied to said cathode and a low impedance region for input signals of high magnitude applied to said cathode, and means for applying input trigger pulses to both said tunnel diode in said bistable circuit and said cathode of said tunnel rectifier to alternately switch said tunnel diode between said first and second stable states, said trigger input pulses being of a magnitude to cause said tunnel rectifier to operate in said low impedance region when said tunnel diode is initially in one of said stable states.

6. A triggerable flip-flop comprising in combination, first and second tunnel diodes each biased to operate bistably between a pair of stable operating states, first and second inverters coupled to said first and second tunnel diodes, respectively, cross-coupling means including a first differentiator for connecting said first tunnel diode to said second inverter and a second differentiator for connecting said second tunnel diode to said first inverter, first and second pulse amplifiers each including a monostably biased tunnel diode coupled, respectively, to said first and second tunnel diodes, and means for applying trigger input pulses of the same polarity to both of said pulse amplifiers to apply amplified pulses to said first and second tunnel diodes to switch one of said first and second diodes from one stable state to the other, whereby the said one tunnel diode produces, when switching, a transition signal which is differentiated, inverted and applied to switch the other tunnel diode from the said other stable state to the said one stable state.

References Cited by the Examiner

UNITED STATES PATENTS

| | | | |
|---|---|---|---|
| 3,096,445 | 7/1963 | Herzog | 307—88.5 |
| 3,131,313 | 4/1964 | Habayeb | 307—88.5 |

ARTHUR GAUSS, *Primary Examiner.*

S. D. MILLER, *Assistant Examiner.*